United States Patent
Kishimoto et al.

[11] Patent Number: 6,133,592
[45] Date of Patent: *Oct. 17, 2000

[54] COMPOUND SEMICONDUCTOR DEVICE AND METHOD FOR PRODUCING THE SAME

[75] Inventors: Katsuhiko Kishimoto, Nara; John Kevin Twynam, Tenri; Naoki Takahashi, Nara, all of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/802,126

[22] Filed: Feb. 19, 1997

[30] Foreign Application Priority Data

Feb. 19, 1996 [JP] Japan ..................... 8-031043

[51] Int. Cl.⁷ .............. H01L 29/78; H01L 33/00
[52] U.S. Cl. ......................... 257/190; 257/191
[58] Field of Search ............... 257/190, 191, 257/197, 199, 198, 103

[56] References Cited

U.S. PATENT DOCUMENTS 5,373,185 12/1994 Sato ........................... 257/587
5,604,356 2/1997 Shiraishi .

FOREIGN PATENT DOCUMENTS 430595 6/1991 European Pat. Off. .

OTHER PUBLICATIONS

M. Hasegawa et al., *Technical Report of IEICE*, ED93–167, MW93–124, pp. 69–74 (1994).
B. Bayraktaroglu et al., *IEEE Electron Device Letters*, 14(10):493–495 (1993).

Primary Examiner—Stephen D. Meier
Attorney, Agent, or Firm—Dike, Bronstein, Roberts & Cushman, LLP; David G. Conlin; George W. Neuner

[57] ABSTRACT

A compound semiconductor device includes a contact structure having a plurality of layers provided on a compound semiconductor layer and an electrode provided on the contact structure. The contact structure includes a first contact layer made of $In_xGa_{1-x}As$ ($0.9 \leq x \leq 1$) on the side closest to the electrode.

10 Claims, 6 Drawing Sheets

COMPOUND SEMICONDUCTOR DEVICE AND METHOD FOR PRODUCING THE SAME

BACKGROUND OF THE INVENTION

1. Field of the Invention

The present invention relates to a semiconductor device. More particularly, the present invention relates to a compound semiconductor device which requires heat dissipation.

2. Description of the Related Art

Conventionally, a compound semiconductor device which requires heat dissipation is known in which a bump is formed on an electrode provided on a semiconductor device formed on a semiconductor substrate. The compound semiconductor device is mounted on a mounting substrate by connecting the bump with an electrode formed on the mounting substrate in such a manner that the upper surface of the bump faces the mounting substrate. Such a mounting is referred to as flip chip bonding which allows for high density mounting of the device and is considered to be an effective way of mounting an LSI (large scale integrated circuit). LSIs have been increasing the number of input terminals and reducing in size at remarkable rate.

In the case where flip chip bonding is used for a power transistor, the bump serves not only as the electrode but also as a heat dissipation path for dissipating heat generated in the device. Particularly, in a hetrojunction bipolar transistor device (hereinafter, simply referred to as an "HBT device"), heat generation density tends to become substantially higher when operated with high current density. Thus, in order to properly operate the HBT device, the heat generated inside the device needs to be dissipated effectively. The above-described flip chip bonding is considered particularly effective for such a requirement.

Technology of using such a bump for heat dissipation is disclosed, for example, in Technical Report of the Institute of Electronics, Information and Communication Engineers, vol. 93, no. 416, "Bump Heat Sink Technology" (1994) by Hasegawa et al., and U.S. Pat. No. 5,373,185 by Sato.

Hereinafter, a conventional compound semiconductor device 300 will be described with reference to FIG. 6. FIG. 6 is a cross-sectional view showing the conventional compound semiconductor device 300. The compound semiconductor device 300 includes a semiconductor multilayer 320, a contact structure 306, an emitter electrode 309, a conductive metal (Ti/Au) layer 312 for plating and a bump 313 provided in this order on a semi-insulating substrate 301 made of GaAs. The bump 313 is electrically connected with the emitter electrode 309 via the conductive metal layer 312 for plating.

The semiconductor multilayer 320 includes a sub-collector layer 302 made of n$^+$ GaAs (thickness: 500 nm, impurity concentration: $5.0 \times 10^{18}/cm^3$), a collector layer 303 made of n$^-$ GaAs (thickness: 700 nm, impurity concentration: $2.0 \times 10^{16}/cm^3$), a base layer 304 made of p$^+$ GaAs (thickness: 80 nm, impurity concentration: $2.0 \times 10^{19}/cm^3$) and an emitter layer 305 made of n$^-$ AlGaAs (thickness: 120 nm, impurity concentration: $5.0 \times 10^{17}/cm^3$) sequentially provided on a semi-insulating substrate 301, thereby forming an HBT device. The sub-collector layer 302, the base layer 304 and the emitter layer 305 are electrically connected to a collector electrode (AuGe/Ni/Au) 311, a base electrode (Ti/Pt/Au) 310 and an emitter electrode (Ti/Pt/Au) 309, respectively.

The contact structure 306 is formed for providing a contact between the emitter layer 305 and the emitter electrode 309 without alloying. The contact structure 306 includes a first contact layer 306a made of n$^+$ GaAs (thickness: 50 nm, impurity concentration: $5.0 \times 10^{18}/cm^3$), a second contact layer 306c made of n$^+$ InGaAs (thickness: 50 nm, impurity concentration: $1.0 \times 10^9/cm^3$ or more) and a graded layer 306b made of n$^+$ InGaAs (thickness: 50 nm, impurity concentration: $1.0 \times 10^{19}/cm^3$). The first contact layer 306a is provided on the emitter layer 305 side, the second contact layer 306c is provided on the emitter electrode 309 side and the graded layer 306b is provided between the first contact layer 306a and the second contact layer 306c.

In the conventional compound semiconductor device 300 shown in FIG. 6, In$_x$Ga$_{1-x}$As (x=0.5) layer is often used as the second contact layer 306c. InGaAs is capable of being doped with an impurity of high concentration and of forming an ohmic electrode having low contact resistance without alloying. Usually, in order to satisfy a strained lattice match and a conduction band match between the second contact layer 306c made of In$_{0.5}$Ga$_{0.5}$As and the first contact layer 306a made of GaAs, the graded layer 306b having an In mole fraction gradually changing from 0 to 0.5 in the thickness direction is formed between the first contact layer 306a and the second contact layer 306c. The In mole fraction of about 0.5 is sufficient for obtaining a satisfactory electrical contact between the first contact layer 306a and the second contact layer 306c. Generally, when the In mole fraction is equal to or more than 0.5, a problem associated with mismatching of lattice constants becomes significant. Therefore, conventionally, an In$_x$Ga$_{1-x}$As layer where x is equal to or more than 0.5 is not intentionally used as the graded layer 306b.

In the above-described conventional compound semiconductor device having bumps, the temperature of the device itself rises due to heat generated upon operation. This heat generation is particularly significant in the case of a power device. As a result, the characteristics and reliability of the power device itself as well as the characteristics and the reliability of devices mounted in the vicinity of the power device are deteriorated. Thus, the conventional device performs poorly as a power device.

SUMMARY OF THE INVENTION

According to one aspect of the present invention, a compound semiconductor device includes a contact structure having a plurality of layers provided on a compound semiconductor layer and an electrode provided on the contact structure. The contact structure includes a first contact layer made of In$_x$Ga$_{1-x}$As ($0.9 \leq x \leq 1$) on the side closest to the electrode.

In one embodiment of the present invention, the compound semiconductor layer includes AlGaAs.

In another embodiment of the present invention, the compound semiconductor layer includes InGaP.

In still another embodiment of the present invention, the contact structure has a super lattice structure in which an InAs layer and a GaAs layer are alternately layered.

In another embodiment of the present invention, a strained lattice match is obtained by decreasing a thickness of molecular layers of InAs while increasing a thickness of molecular layers of GaAs in the super lattice structure.

In another embodiment of the present invention, the contact structure includes a graded layer having at least an In$_x$Ga$_{1-x}$As ($0 \leq x \leq 0.1$) layer on the compound semiconductor layer side, an $In_xGa_{1-x}As$ layer provided on the $In_xGa_{1-x}As$ ($0 \leq x \leq 0.1$) layer having mole fraction x changing from 0.1 to 0.9 starting from the compound semiconductor layer side toward the electrode side and an $In_xGa_{1-x}As$ ($0.9 \leq x < 1$) layer making contact with the first contact layer.

In another embodiment of the present invention, the thickness of the $In_xGa_{1-x}As$ ($0.1 \leq x < 0.9$) layer is equal to or less than about 50% of the total thickness of the graded layer.

According to another aspect of the present invention, a compound semiconductor device includes a semiconductor multilayer formed on a substrate, a contact structure including at least $In_xGa_{1-x}As$ ($0.9 \leq x \leq 1$) formed on the semiconductor multilayer and an electrode formed on the contact structure in which heat generated in the semiconductor multilayer is dissipated outwardly through the contact structure and the electrode.

In one embodiment of the present invention, the semiconductor multilayer forms a heterojunction bipolar transistor including a collector layer made of GaAs, a base layer made of GaAs and an emitter layer made of AlGaAs or InGaP.

In another embodiment of the present invention, a bump is formed on the electrode so as to dissipate heat through the bump.

According to another aspect of the present invention, a method for producing a compound semiconductor device including a semiconductor multilayer formed on a substrate, a contact structure having a plurality of layers formed on the semiconductor multilayer and a first electrode provided on the contact structure is provided in which heat generated in the semiconductor multilayer is dissipated outwardly through the contact layer and the first electrode. The method includes the steps of forming at least one alloy electrode on the semiconductor multilayer and thereafter forming the first electrode on the contact structure.

In one embodiment of the present invention, the first electrode provided on the contact structure is an emitter electrode made of Ti/Pt/Au.

In another embodiment of the present invention, the alloy electrode is a collector electrode made of AuGa/Ni/Au and the alloy electrode is formed by heat treatment for alloying.

According to another embodiment of the present invention, a method for producing a compound semiconductor device including a semiconductor multilayer formed on a substrate, a contact structure having a plurality of layers formed on the semiconductor multilayer and a first electrode provided on the contact structure is provided in which heat generated in the semiconductor multilayer is dissipated to outside through the contact structure and the first electrode and the semiconductor multilayer includes a sub-collector layer, a collector layer and a base layer along with an AuGe/Ni/Au alloy collector electrode formed on the sub-collector layer and a Pt/Ti/Pt/Au alloy base electrode formed on the base layer. The method includes the step of: forming the collector electrode after forming the base electrode.

In still another embodiment of the present invention, the first electrode is an emitter electrode made of a material having a high melting point/Ti/Pt/Au.

Thus, the invention described herein makes possible the advantages of (1) providing a novel compound semiconductor device capable of withstanding high power operation and (2) providing a method for producing the compound semiconductor device.

These and other advantages of the present invention will become apparent to those skilled in the art upon reading and understanding the following detailed description with reference to the accompanying figures.

DESCRIPTION OF THE PREFERRED EMBODIMENTS

The present inventors considered that the device characteristics and reliability of a conventional compound semiconductor device and the operation characteristics and reliability of devices mounted in the vicinity thereof are deteriorated upon high power operation due to unsatisfactory heat dissipation characteristic of the device. Therefore, the present inventors have conducted studies on enhancing the heat dissipation characteristics of compound semiconductor devices and determined the following.

Figure 6:
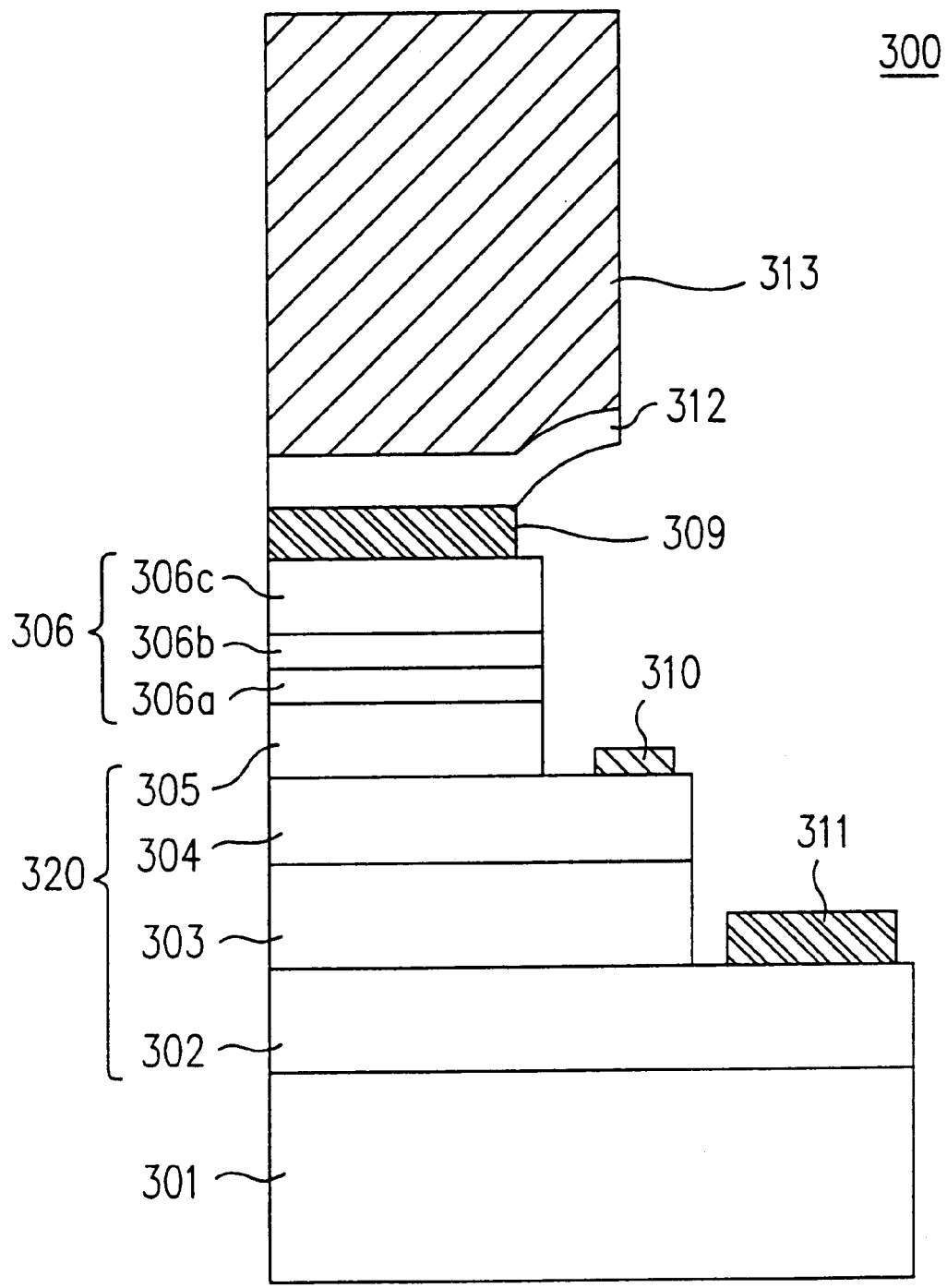
FIG. 6 is a cross-sectional view showing a conventional compound semiconductor device.

In the conventional compound semiconductor device 300 having the bump shown in FIG. 6, heat is mainly generated between the n⁻ GaAs collector layer 303 and the p⁺ GaAs base layer 304. The generated heat is dissipated through the first contact layer 306a, the graded layer 306b and the second contact layer 306c. As described above, each of the first contact layer 306a, the graded layer 306b and the second contact layer 306c has a thickness of about 50 nm which is substantially thin. Therefore, these layers 306a, 306b and 306c were considered not to have any substantial effect in terms of heat dissipation.

Figure 4:
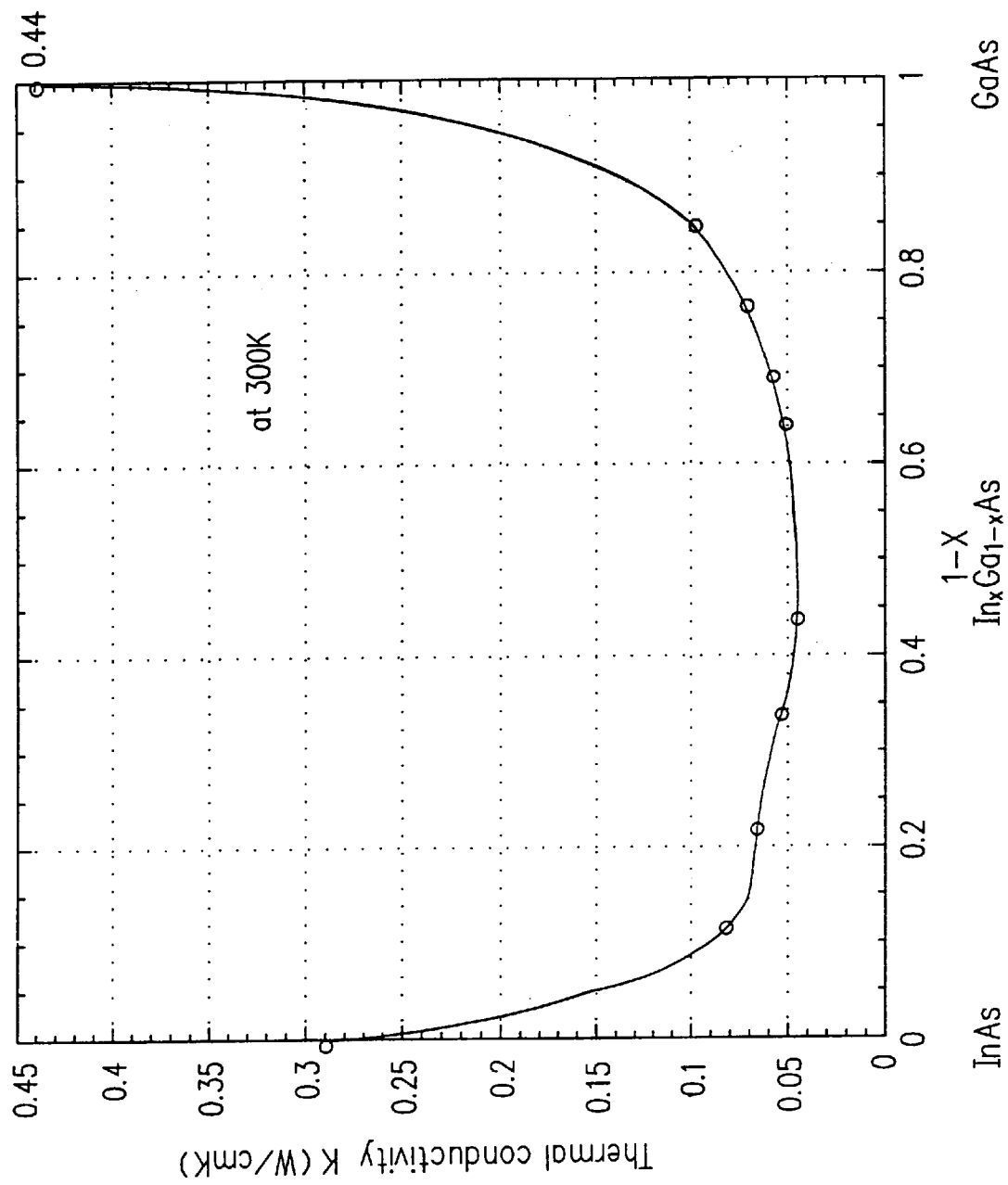
FIG. 4 is a graph representing a thermal conductivity of $In_xGa_{1-x}As$ at 300K depending on mole fraction 1-x.

In order to be sure, the present inventors examined thermal conductivity of each material forming the first contact layer 306a, the graded layer 306b and the second contact layer 306c. The results are shown in Table 1. FIG. 4 is a graph representing the results shown in Table 1. As can be appreciated from the graph, GaAs has the best thermal conductivity among $In_xGa_{1-x}As$ type materials. The thermal conductivity becomes low as the amount of In replacing Ga increases. However, once the amount of In replacing Ga exceeds about 0.5, the thermal conductivity again rises. Thus, it is considered that the second contact layer 306c made of $In_{0.5}Ga_{0.5}As$ has the lowest thermal conductivity, and the graded layer 306b has thermal conductivity which gradually becomes high from the second contact layer 306c toward the first contact layer 306a.

TABLE 1

| InGaAs mole fraction | Thermal conductivity (W/cmK) | Thermal resistivity (cmK/W) |
| --- | --- | --- |
| InAs | 0.289 | 3.46 |
| In0.88Ga0.12As | 0.082 | 12.20 |
| In0.78Ga0.22As | 0.068 | 14.71 |
| In0.66Ga0.34As | 0.056 | 17.86 |
| In0.56Ga0.44As | 0.048 | 20.83 |
| In0.36Ga0.64As | 0.055 | 18.18 |
| In0.31Ga0.69As | 0.061 | 16.39 |
| In0.24Ga0.76As | 0.074 | 13.51 |
| In0.16Ga0.84As | 0.095 | 10.53 |
| GaAs | 0.44 | 2.27 |

As described above, in the conventional compound semiconductor device 300 shown in FIG. 6, the total thickness of the second contact layer 306c and the graded layer 306b is about 100 nm at maximum which is extremely thin. Thus, the second contact layer 306c and the graded layer 306b were not considered to have thermal resistance to such a degree that heat dissipation of the semiconductor device is hindered. However, as can be appreciated from the graph shown in FIG. 4, there is a limit to the heat dissipation characteristics of the contact structure 306. As will be described in the following examples, it was found that the heat dissipation characteristics of a semiconductor device was improved by using the layering of the contact structure according to the present invention.

Hereinafter, the present invention will be described by way of illustrative examples with reference to the accompanying drawings.

EXAMPLE 1

Figure 1:
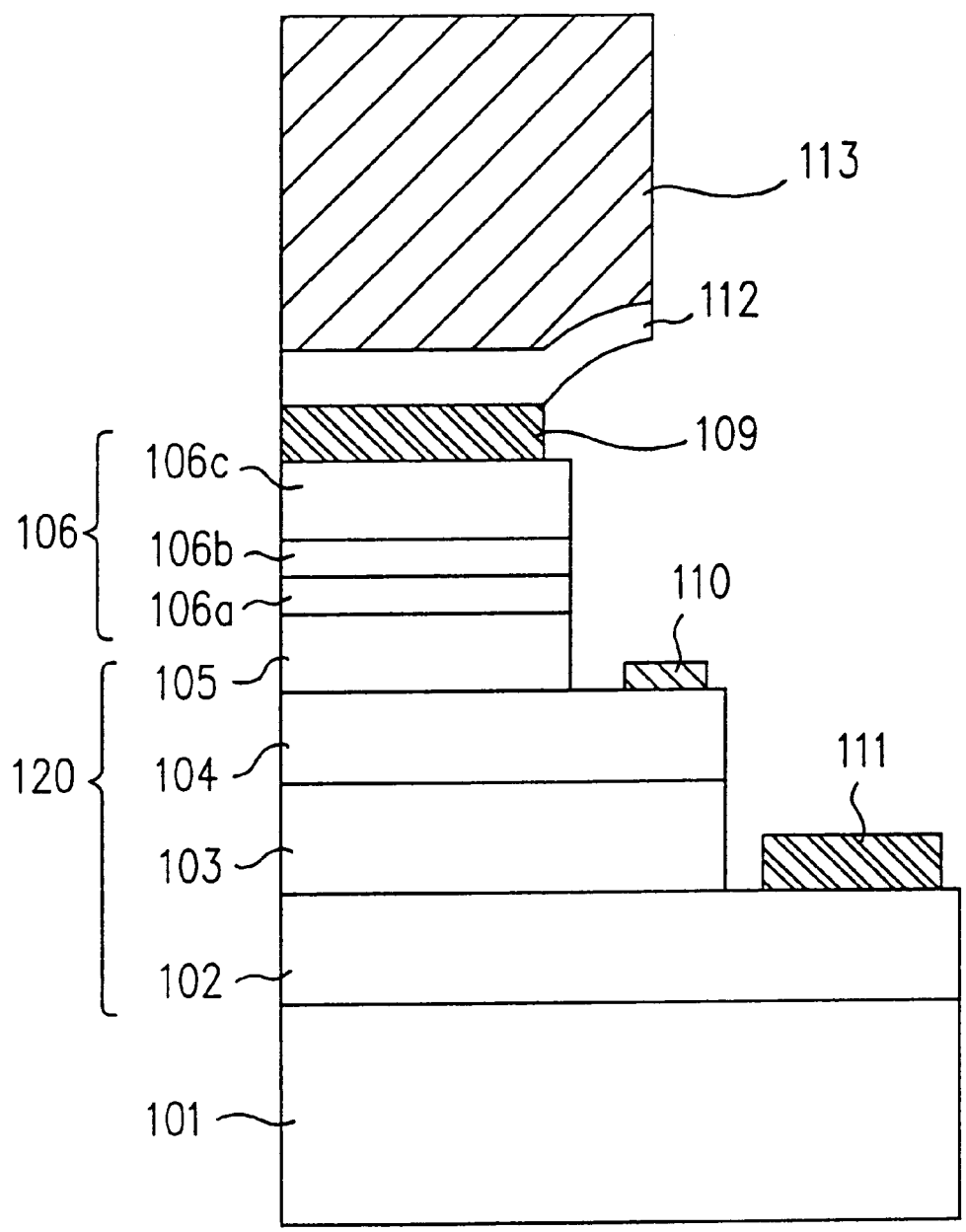
FIG. 1 is a cross-sectional view showing a compound semiconductor device according to a first example of the present invention.

FIG. 1 is a cross-sectional view showing a compound semiconductor device 100 according to a first example of the present invention. The compound semiconductor device 100 includes a semiconductor multilayer 120, a contact structure 106, an electrode 109 made of Ti/Pt/Au, a conductive metal (Ti/Au) layer 112 for plating and a bump 113 sequentially provided on a semi-insulating substrate 101 made of GaAs. The bump 113 is electrically connected with the electrode 109 via the conductive metal layer 112 for plating.

The semiconductor multilayer 120 includes a sub-collector layer 102 made of n$^+$ GaAs (thickness: about 500 nm, impurity concentration: about $5.0 \times 10^{18}$/cm$^3$), a collector layer 103 made of n GaAs (thickness: about 700 nm, impurity concentration: about $2.0 \times 10^{16}$/cm$^3$), a base layer 104 made of p$^+$ GaAs (thickness: about 80 nm, impurity concentration: about $2.0 \times 10^{19}$/cm$^3$) and an emitter layer 105 made of n$^-$ AlGaAs (thickness: about 120 nm, impurity concentration: about $5.0 \times 10^{17}$/cm$^3$) sequentially provided on the semi-insulating substrate 101, thereby forming an AlGaAs/GaAs HBT device.

The contact structure 106 is provided for obtaining contact between the emitter layer 105 and the emitter electrode 109 without alloying. The contact structure 106 includes a first contact layer 106a made of n$^+$ GaAs (thickness: about 50 nm, impurity concentration: about $5.0 \times 10^{18}$/cm$^3$) on the emitter layer 105 side, a second contact layer 106c made, of n$^+$ InAs (thickness: about 50 nm, impurity concentration: about $1.0 \times 10^{19}$/cm$^3$ or more) on the emitter electrode 109 side and a graded layer 106b provided between the first contact layer 106a and the second contact layer 106c. The graded layer 106b is a super lattice structure made of GaAs and InAs.

Figure 2:
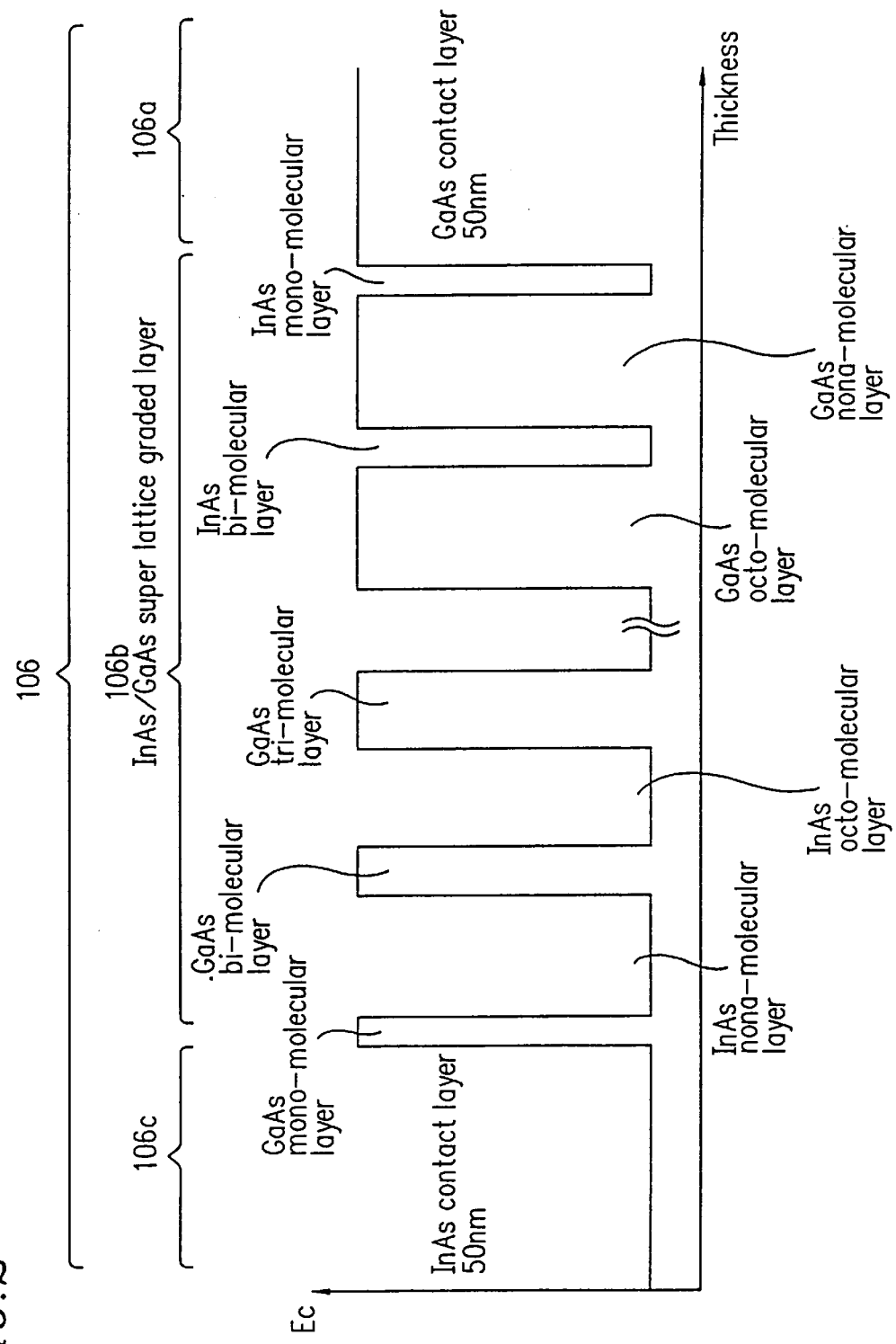
FIG. 2 is a schematic diagram showing a structure and an energy band of a contact structure of the compound semiconductor device according to the first example of the present invention.

Hereinafter, details of the contact structure 106 will be described with reference to FIG. 2. FIG. 2 is a schematic diagram showing the structure and the energy band of the contact structure 106. In FIG. 2, the horizontal axis represents a position within the contact structure 106 in the thickness direction and the vertical axis represents the energy level of the conduction band of the contact structure 106. The graded layer 106b includes molecular layers made of GaAs and molecular layers made of InAs which are alternately layered. The thickness of the GaAs molecular layers decreases while the thickness of the InAs molecular layers increases progressing from the GaAs first contact layer 106a side toward the InAs second contact layer 106c side (i.e., from the right to the left in FIG. 2). Specifically, the contact structure 106 shown in FIG. 2 includes the GaAs contact layer 106a, an InAs mono-molecular layer, a GaAs non-molecular layer, an InAs bi-molecular layer, a GaAs octo-molecular layer, . . . , a GaAs tri-molecular layer, an InAs octo-molecular layer, a GaAs bi-molecular layer, an InAs non-molecular layer, a GaAs mono-molecular layer and the InAs contact layer 106c in this order. Such a super lattice structure allows a strained lattice match and a conduction band match to be obtained between the first contact layer 106a made of GaAs and the second contact layer 106c made of InAs, and also provides for the graded layer 106b to have high thermal conductivity.

The thickness and the number of the InAs molecular layers and the GaAs molecular layers in the super lattice structure are not limited to those of the structure shown in FIG. 2. The thickness and the number of InAs molecular layers and GaAs molecular layers can be changed as long as strained lattice match, conduction band match and high thermal conductivity are obtained. For example, the thickness of the molecular layer in the super lattice structure can range from a bi-molecular layer to an 18-fold-molecular layer, alternately layered. Moreover, the thickness of the InAs and the GaAs molecular layers does not have to be changed in a regular manner as long as strained lattice match is achieved.

The semiconductor device 100 shown in FIG. 1 is generally produced by the following method.

First, the sub-collector layer 102, the collector layer 103, the base layer 104, the emitter layer 105 and the contact structure 106 (i.e., the first contact layer 106a, the graded layer 106b and the second contact layer 106c) are epitaxially grown in this order on the semi-insulating GaAs substrate 101 by an MBE (molecular beam epitaxy) method or an MOCVD (metal organic chemical vapor deposition) method, or the like.

Thereafter, the semiconductor multilayer 120 (i.e., the sub-collector layer 102, the collector layer 103, the base layer 104 and the emitter layer 105) on the semi-insulating GaAs substrate 101 is etched into a desired pattern by a suitable combination of photolithography and etching methods. Then, as shown in FIG. 1, the collector electrode 111, the base electrode 110 and the emitter electrode 109 are formed. The step of etching and the step of forming the electrodes can be suitably combined as follows.

In the first example, the emitter electrode 109 and the base electrode 110 are made of Ti/Pt/Au and the collector electrode 111 is made of AuGe/Ni/Au. The temperature for alloying the AuGe/Ni/Au is approximately 390° C. Since Ti/Pt/Au requires no alloying, the collector electrode 111 is first formed by alloying and then, the base electrode 110 and the emitter electrode 109 are formed. The above-described order of forming the electrodes is a significant feature of the present invention. Conventionally, in order to simplify the steps, first, the emitter and the base electrodes were formed and then, the collector electrode was alloyed. By reversing the order of the formation of the electrodes as in the first example of the present invention, heat dissipation characteristics are enhanced by approximately 10% because the emitter electrode is prevented from being deteriorated by alloying.

Although the base electrode 110 is made of Ti/Pt/Au in the first example of the present invention, Pt/Ti/Pt/Au can also be used in which case the Pt/Ti/Pt/Au is alloyed at a temperature of 400° C. or more. In such a case, the collector electrode 111 is preferably formed and alloyed after the base electrode 110 is formed and alloyed. Specifically, after alloying the Pt/Ti/Pt/Au (i.e., the base electrode 110) which requires treatment at higher temperature, deposition and alloying of AuGe/Ni/Au are conducted to form the collector electrode 111. Thus, the base electrode 110 is prevented from being influenced by the second alloying. Therefore, in this case, Ti/Pt/Au can be formed as the emitter electrode 109 after alloying the base electrode and the collector electrode.

In the case where Ti/Pt/Au is formed as the emitter electrode after forming a material having a high melting point such as tungsten nitride and tungsten silicide, the emitter electrode 109 can be formed before alloying because the emitter electrode 109 is hardly effected by alloying.

In the first example of the present invention, the contact structure 106 does not have to be formed immediately above the semiconductor multilayer 120. A so-called ballast resistance layer can be formed between the contact structure 106 and the semiconductor multilayer 120. The ballast resistant layer can be formed, for example, with AlGaAs doped with impurity of low concentration.

Then, in order to form the bump 113 immediately above the emitter electrode 109, an $SiN_x$ film is formed to have a thickness of about 100 nm by a plasma CVD method on the entire surface of the semiconductor substrate 101 having the semiconductor multilayer 120, the contact structure 106, the emitter electrode 109, the base electrode 110 and the collector electrode 111 formed thereon. Thereafter, an opening is formed in the SiN, film only above the emitter electrode 109 by patterning and etching. Then, the conductive metal (Ti/Au) layer 112 for plating is formed on the entire surface of the substrate so as to cover the emitter electrode 109 exposed at the opening. A photoresist layer patterned into a desired bump shape is formed on the conductive metal layer 112 for plating. Then, the bump is formed by plating gold on the conductive metal layer 112 for plating. Thereafter, the photoresist layer is removed, thereby completing the compound semiconductor device 100.

In the first example of the present invention, after forming the contact structure 106, the collector electrode 111, the base electrode 110 and the emitter electrode 109 are formed in an appropriate order depending on the structure thereof. Alternatively, the collector electrode 111 can be formed (including the alloy treatment) after forming the emitter layer 109, and then the contact structure can be formed.

EXAMPLE 2

Figure 3:
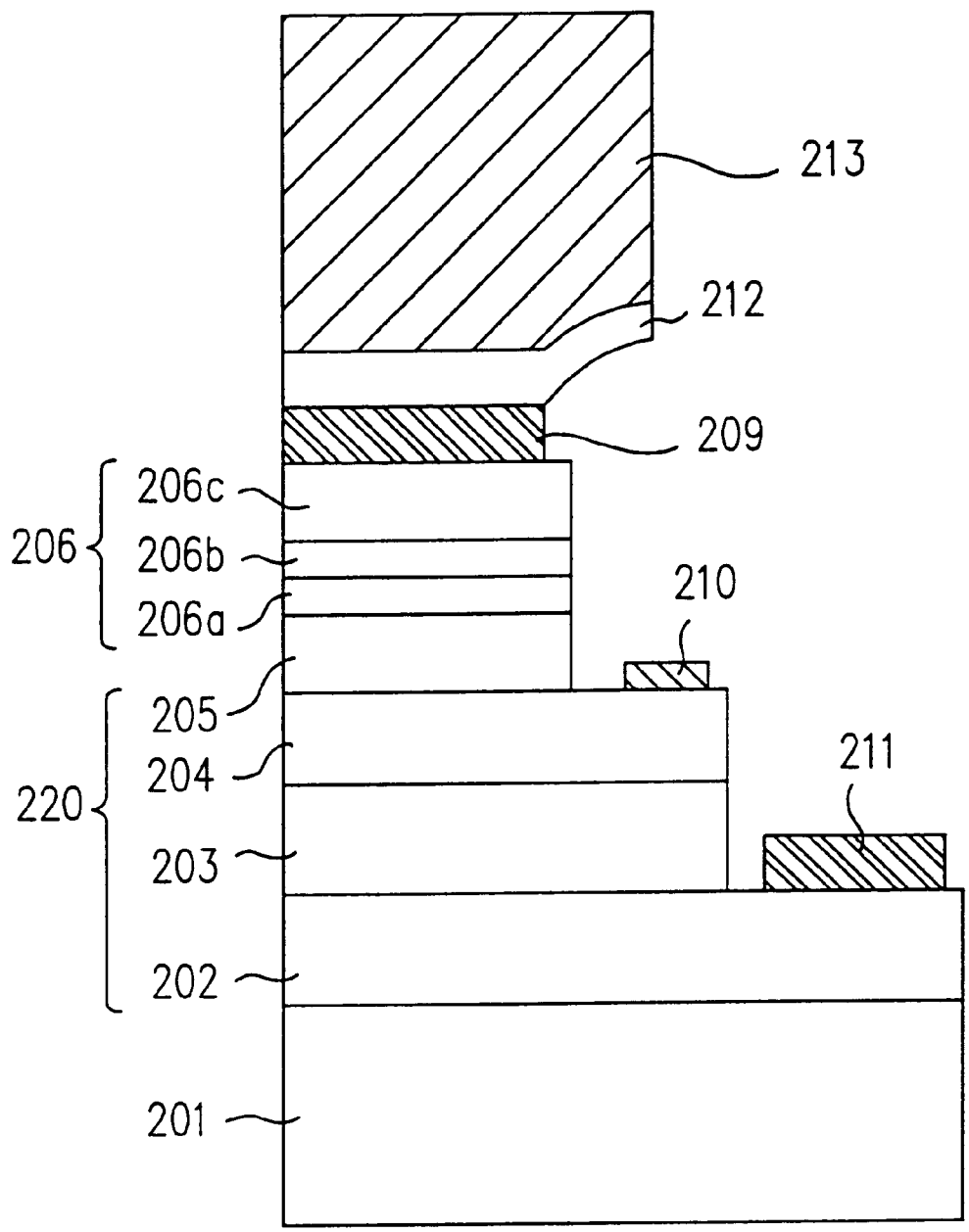
FIG. 3 is a cross-sectional view showing a compound semiconductor device according to a second example of the present invention.

FIG. 3 is a cross-sectional view showing a compound semiconductor device 200 according to a second example of the present invention. The compound semiconductor device 200 has an emitter layer 205 and a contact structure 206 which are different from those of the semiconductor device 100 according to the first example of the present invention. The emitter layer 205 of the compound semiconductor device 200 and the emitter layer 105 of the compound semiconductor device 100 are interchangeable. In other words, the emitter layer 105 is applicable to the compound semiconductor device 200 and the emitter layer 205 is applicable to the compound semiconductor device 100.

Hereinafter, the compound semiconductor device 200 according to the second example of the present invention will be described in detail mainly focusing on a contact structure 206 which is a significant feature of the second example of the present invention.

The compound semiconductor device 200 includes a semiconductor multilayer 220, a contact structure 206, an emitter electrode 209, a conductive metal (Ti/Au) layer 212 for plating and a bump 213 sequentially provided on a semi-insulating substrate 201 made of GaAs. The bump 213 is electrically connected with the electrode 209 via the conductive metal layer 212 for plating.

The semiconductor multilayer 220 includes a sub-collector layer 202 made of $n^+$ GaAs (thickness: about 500 nm, impurity concentration: about $5.0 \times 10^{18}/cm^3$), a collector layer 203 made of n GaAs (thickness: about 700 nm, impurity concentration: about $2.0 \times 10^{16}/cm^3$), a base layer 204 made of $p^+$ GaAs (thickness: about 80 nm, impurity concentration: about $2.0 \times 10^{19}/cm^3$) and an emitter layer 205 made of $n^-$ InGaP (thickness: about 120 nm, impurity concentration: about $5.0 \times 10^{17}/cm^3$) sequentially provided on the semi-insulating substrate 201, thereby forming an InGaP/GaAs HBT device.

Figure 5A:
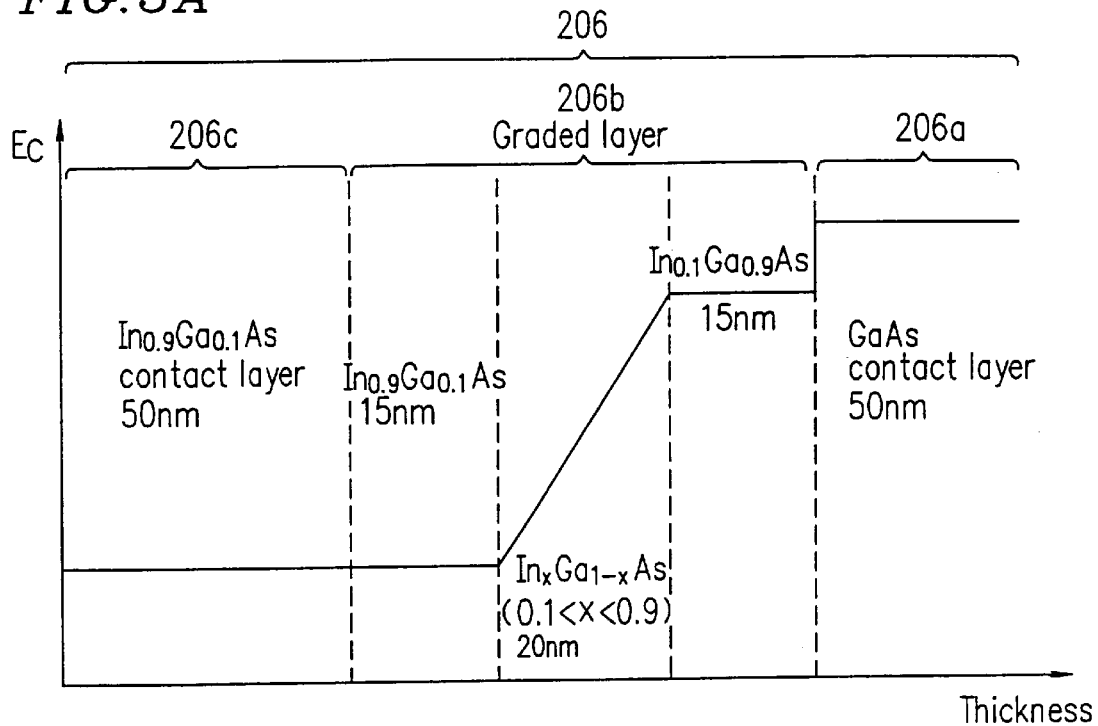
FIG. 5A is a schematic diagram showing a structure and an energy band of a contact structure of the compound semiconductor device according to the second example of the present invention.

In the case of the compound semiconductor device 200, the emitter layer 205 is made of $n^-$ InGaP (impurity concentration: about $5.0 \times 10^{17}/cm^3$) and the contact structure 206 has a structure shown in FIG. 5A.

FIG. 5A is a schematic diagram showing the structure and the energy band of the contact structure 206. In FIG. 5A, the horizontal axis represents a position within the contact structure 206 in the thickness direction and the vertical axis represents the energy level of the conduction band of the contact structure 206.

The contact structure 206 includes a first contact layer 206a (thickness: about 50 nm) made of GaAs, a graded layer 206b (thickness: about 50 nm) and a second contact layer 206c (thickness: about 50 nm) made of $In_{0.9}Ga_{0.1}As$. The graded layer 206b includes an $In_{0.1}Ga_{0.9}As$ layer having a thickness of about 15 nm on the first contact layer 206a side, an $In_{0.9}Ga_{0.1}As$ layer having a thickness of about 15 nm on the second contact layer 206c side and an $In_xGa_{1-x}As$ layer $(0.1 \leq x \leq 0.9$, thickness: about 20 nm) layer provided between the $In_{0.1}Ga_{0.9}As$ layer and the $In_{0.9}Ga_{0.1}As$ layer, the mole fraction of the $In_xGa_{1-x}As$ layer continuously changing.

In such a contact structure 206, the thickness of the $In_xGa_{1-x}As$ $(0.1 \leq x \leq 0.9)$ layer having low thermal conductivity can be made thin. As a result, the graded layer 206b contributes to a strained lattice match and a conduction band match between the first contact layer 206a and the second contact layer 206c as well as to a high thermal conductivity of the whole contact structure 206.

Figure 5B:
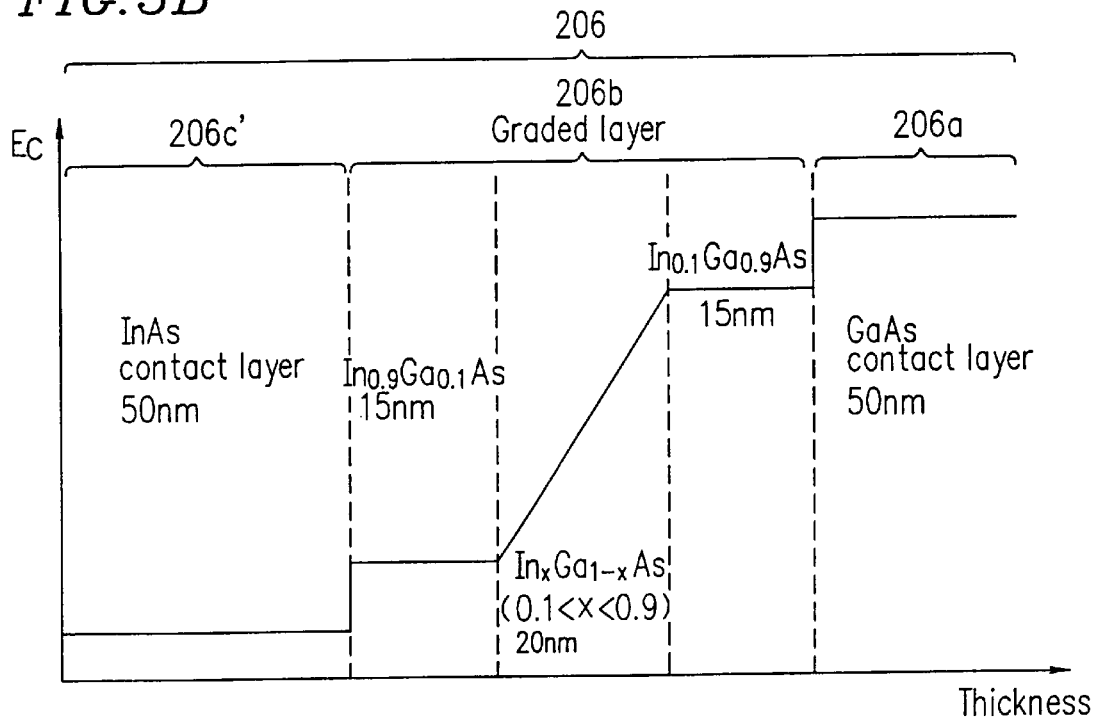
FIG. 5B is a schematic diagram showing a structure and an energy band of another contact structure of the compound semiconductor device according to the second example of the present invention.

As shown in FIG. 5B, even in the case where an InAs layer is used as a second contact layer 206c', a strained lattice match and a conduction band match between the first contact layer 206a and the second contact layer 206c' are achieved since the graded layer 206b has the $In_{0.9}Ga_{0.1}As$ layer on the second contact layer 206c' side.

The graded layer 206b in the second example of the present invention at least includes an $In_xGa_{1-x}As$ $(0 \leq x \leq 0.1)$ layer and an $In_xGa_{1-x}As$ $(0.9 \leq x < 1)$ layer adjacent to the first and the second contact layer, respectively. The thickness of the $In_xGa_{1-x}As$ $(0.1 \leq x < 0.9)$ layer having lower thermal conductivity provided between the $In_xGa_{1-x}As$ ($0 \leq x \leq 0.1$) layer and the $In_xGa_{1-x}As$ ($0.9 \leq x < 1$) layer is thinner than that of the conventional contact structure. The thickness of the $In_xGa_{1-x}As$ ($0.1 \leq x < 0.9$) layer is preferably equal to or less than about 50% of the total thickness of the graded layer 206b. In terms of strained lattice match, the thickness of the $In_xGa_{1-x}As$ ($0.1 \leq x < 0.9$) layer is preferably equal to or more than about 30% and, most preferably, equal to approximately 40% of the total thickness of the graded layer 206b.

The compound semiconductor device 200 can be produced by a method similar to that for producing the compound semiconductor device 100 of the first example of the present invention. In the case where at least one of the base electrode 210 and the collector electrode 211 is made of an alloy type material, the emitter electrode 209 is preferably formed after forming the base electrode 210 and the collector electrode 211 as in the first example. The graded layer 206b can also be formed by depositing while continuously or stepwise changing the Ga and the In mole fractions.

In FIG. 5A, the energy level Ec is linearly changed in the conduction band of the $In_xGa_{1-x}As$ ($0.1 \leq x < 0.9$) layer. Alternatively, the energy level Ec can change stepwise or in a curved line. The structure of the graded layer 206b is such that the mole fraction thereof is gradually changed to allow the strained lattice match and the conduction band match between the first contact layer 206a and the second contact layer 206c.

Alternatively, $In_xGa_{1-x}As$ ($0.9 \leq x < 1$) can also be used as a material for the second contact layer 206c.

Moreover, instead of using the graded layer 206b in the contact structure 206 described in the second example of the present invention, a super lattice structure similar to that in the first example can also be used. For example, the graded layer can have a super lattice structure in which molecular layers of $In_xGa_{0.9}As$ and molecular layers of $In_{0.9}Ga_{0.1}As$ are alternately provided. In the case where the first contact layer 206a is made of $In_xGa_{1-x}As$ ($0 \leq x \leq 0.1$) and the second layer 206c is made of $In_xGa_{1-x}As$ ($0.9 \leq x \leq 1$), the super lattice structure made of these layers can also be used.

The mole fraction of materials forming the graded layer 206b does not necessarily match with those of the contact layers 206a and 206b at the junction boundaries as long as the strained lattice match and the conduction band match between the layers are obtained.

The graded layer 206b of the second example can be combined with the super lattice structure described in the first example of the present invention. Furthermore, the contact structure of the first and the second example are interchangeable within the scope of the present invention.

Although an HBT device made of AlGaAs/GaAs and an HBT device made of InGaP/GaAs are described in the first and second examples of the present invention, the present invention is not limited to these HBT devices. For example, the emitter layer can be made of GaAs.

Moreover, the present invention is also applicable for an InP type HBT device using a semi-insulating InP substrate instead of the semi-insulating GaAs substrate. In the above-described examples, the bump is formed on the electrode provided on the contact structure to enhance the heat dissipation effect. However, the bump is not necessarily required. The bump is not required in the case where heat dissipation is sufficient, for example, by dissipating heat through lines connected to the HBT device via contact structure of the present invention. Furthermore, the application of the present invention is not limited to HBT devices. The present invention is also applicable to devices which require electrical connection via contact structure and require dissipation of heat generated in the device through the contact structure.

According to the present invention, a contact structure can be obtained in which thermal resistance is about 30% or less than that of a conventional contact structure. Accordingly, a compound semiconductor device having excellent heat dissipation and a method for producing such a compound semiconductor device are provided. According to the present invention, the heat generated inside the device can be efficiently dissipated. Thus, an operation characteristic and reliability of the device is not deteriorated by heat. As a result, a power transistor having an excellent operation characteristic and reliability can be provided.

Moreover, the present invention is not limited to a compound semiconductor device having bumps. The present invention is applicable to a compound semiconductor device in which a metal portion referred to as a thermal shunt is formed on the device. The heat dissipation technology utilizing the thermal shunt is disclosed, for example, in "Very-High-Power-Density CW Operation of GaAs/AlGaAs Microwave Heterojunction Bipolar Transistors", IEEE EDL. Vol. 14., No. 10, October, 1993, pp. 493–495 by Burhan Bayraktaaroglu et al. The heat dissipation characteristic of the compound semiconductor can be improved by thermally connecting the metal portion for heat dissipation used as the thermal shunt and the compound semiconductor via an electrode structure (i.e., a contact structure) of the present invention. In this case, the metal portion and the electrode structure (i.e., the contact structure) according to the present invention do not have to act as electrodes.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A compound semiconductor device, said device comprising a contact structure provided on a compound semiconductor layer, wherein the contact structure has a plurality of layers of $In_xGa_{1-x}AS$, wherein $0 < x \leq 1$, the plurality of layers comprising a first layer formed closest to the compound semiconductor layer and formed of $In_{x1}Ga_{x-x1}As$, wherein x1 is a constant in said first layer and is in the range of $0 < x1 \leq 0.1$.

2. A compound semiconductor device according to claim 1, wherein the compound semiconductor layer includes InGaP.

3. A compound semiconductor device according to claim 1, wherein the plurality of $In_xGa_{1-x}AS$ layers of the contact structure includes:
the first layer formed of $In_{x1}Ga_{1-x1}AS$, wherein $0 < x2 \leq 0.1$):
a second layer provided on the first layer, the second layer being formed of $In_{x1}Ga_{1-x2}AS$ wherein a mole fraction x2 changes from 0.1 to 0.9 starting from the compound semiconductor layer side toward the upper side of the contact structure; and
a third layer being formed of $In_{x3}Ga_{1-x3}AS$, wherein $0.9 \leq x3 \leq 1$, provided on the second layer.

4. A compound semiconductor device according to claim 3, wherein the thickness of the second layer, which is formed of $In_{x2}Ga_{1-x2}AS$, is equal to or less than about 50% of the total thickness of the contact structure.

5. A compound semiconductor device, said device comprising:

a semiconductor multilayer formed an a substrate, and a contact structure provided on the semiconductor multilayer, wherein the contact structure has a plurality of layers of $In_xGa_{1-x}As$, wherein $0<x\leq 1$, the plurality of layers comprising a first layer formed closest to the semiconductor multilayer, said first layer formed closest to the compound semiconductor layer and formed of $In_{x1}Ga_{1-x1}As$, wherein x1 is a constant in said first layer and is in the range of $0<x1\leq 0.1$, wherein heat generated in the semiconductor multilayer is dissipated outwardly through the contact structure and an electrode provided on the contact structure.

6. A compound semiconductor device according to claim 5, wherein the semiconductor multilayer forms a heterojunction bipolar transistor including a collector layer made from GaAs, a base layer made of GaAs and an emitter layer made of InGaP.

7. A compound semiconductor device according to claim 5, wherein a bump is formed on the electrode so as to dissipate heat through the bump.

8. A compound semiconductor device comprising a heterojunction bipolar transistor having an emitter contact structure having high thermal conductivity, wherein the emitter contact structure has a super lattice structure in which an InAs layer and a GaAs layer are alternately layered, and the high thermal conductivity of the super lattice structure provides a heat dissipation means for the compound semiconductor device.

9. A compound semiconductor device according to claim 8, wherein the heterojunction bipolar transistor has an emitter structure which includes InGaP.

10. A compound semiconductor device according to claim 8, wherein a strained lattice match is obtained by decreasing a thickness of molecular layers of InAs while increasing a thickness of molecular layers of GaAs in the super lattice structure.

* * * * *